US008082932B2

(12) United States Patent
Rye et al.

(10) Patent No.: US 8,082,932 B2
(45) Date of Patent: *Dec. 27, 2011

(54) SINGLE SIDE WORKPIECE PROCESSING

(75) Inventors: Jason Rye, Kalispell, MT (US); Daniel J. Woodruff, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 1108 days.

This patent is subject to a terminal disclaimer.

(21) Appl. No.: 11/359,969

(22) Filed: Feb. 22, 2006

(65) Prior Publication Data

US 2006/0141809 A1     Jun. 29, 2006

Related U.S. Application Data

(63) Continuation-in-part of application No. 11/075,099, filed on Mar. 8, 2005.

(60) Provisional application No. 60/552,642, filed on Mar. 12, 2004.

(51) Int. Cl.
*B08B 3/08* (2006.01)

(52) U.S. Cl. ....... 134/180; 134/181; 134/200; 294/64.2; 294/64.3

(58) Field of Classification Search .................. 134/180, 134/181, 200, 902, 149, 153; 438/689, 694, 438/758; 294/64.1, 64.2, 64.3
See application file for complete search history.

(56) References Cited

U.S. PATENT DOCUMENTS

| | | |
|---|---|---|
| 4,510,176 A | 4/1985 | Cuthbert et al. |
| 5,032,217 A | 7/1991 | Tanaka |
| 5,591,262 A | 1/1997 | Sago et al. |
| 5,762,708 A | 6/1998 | Motoda et al. |
| 5,762,751 A | 6/1998 | Bleck et al. |
| 5,815,762 A | 9/1998 | Sakai et al. |
| 6,027,602 A | 2/2000 | Hung et al. |
| 6,056,825 A | 5/2000 | Sumnitsch |

(Continued)

FOREIGN PATENT DOCUMENTS

JP         2003017464         1/2003

(Continued)

OTHER PUBLICATIONS

U.S. Patent and Trademark Office, Combined International Search Report and Written Opinion of the Searching Authority for PCT/US2007/062448, dated Mar. 27, 2008.

(Continued)

*Primary Examiner* — Joseph L Perrin
*Assistant Examiner* — Benjamin Osterhout
(74) *Attorney, Agent, or Firm* — Kenneth H. Ohriner; Perkins Coie LLP

(57) ABSTRACT

A centrifugal workpiece processor for processing semiconductor wafers and similar workpieces includes a head which holds and spins the workpiece. The head includes a rotor having a gas system. Gas is sprayed or jetted from inlets in the rotor to create a rotational gas flow. The rotational gas flow causes pressure conditions which hold the edges of a first side of the workpiece against contact pins on the rotor. The rotor and the workpiece rotate together. Guide pins adjacent to a perimeter may help to align the workpiece with the rotor. The rotor may have cylindrical side walls joined to a top plate, and with the gas inlets located in the cylindrical sidewalls. The head is moveable into engagement with a bowl. Spray nozzles in the bowl spray a process liquid onto the second side of the workpiece, as the workpiece is spinning, to process the workpiece.

15 Claims, 17 Drawing Sheets

U.S. PATENT DOCUMENTS

| | | | |
|---|---|---|---|
| 6,095,582 | A | 8/2000 | Siniaguine et al. |
| 6,099,056 | A | 8/2000 | Siniaguine et al. |
| 6,149,759 | A | 11/2000 | Guggenberger |
| 6,152,507 | A | 11/2000 | Pirker |
| 6,168,697 | B1 | 1/2001 | Siniaguine et al. |
| 6,193,798 | B1 | 2/2001 | Sumnitsch |
| 6,203,661 | B1 | 3/2001 | Siniaguine et al. |
| 6,251,692 | B1 | 6/2001 | Hanson |
| 6,328,846 | B1 | 12/2001 | Langen et al. |
| 6,402,843 | B1 | 6/2002 | Siniaguine et al. |
| 6,423,642 | B1 | 7/2002 | Peace et al. |
| 6,435,200 | B1 | 8/2002 | Langen |
| 6,492,284 | B2 | 12/2002 | Peace et al. |
| 6,494,221 | B1 | 12/2002 | Sellmer et al. |
| 6,536,454 | B2 | 3/2003 | Lindner |
| 6,548,411 | B2 | 4/2003 | Wirth et al. |
| 6,667,242 | B2 | 12/2003 | Siniaguine et al. |
| 6,672,318 | B1 | 1/2004 | Tsuchiya et al. |
| 6,680,253 | B2 * | 1/2004 | Wirth et al. ............. 438/694 |
| 6,848,194 | B2 | 2/2005 | Treur |
| 6,858,092 | B2 | 2/2005 | Langen |
| 6,863,772 | B2 | 3/2005 | Cheng et al. |
| 6,930,046 | B2 | 8/2005 | Hanson et al. |
| 6,969,682 | B2 | 11/2005 | Hanson et al. |
| 7,007,702 | B2 | 3/2006 | Langen |
| 7,066,787 | B2 | 6/2006 | Nakanishi et al. |
| 7,217,325 | B2 | 5/2007 | Hanson |
| 7,229,522 | B2 | 6/2007 | Toshima et al. |
| 7,267,749 | B2 | 9/2007 | Wilson et al. |
| 7,279,116 | B2 | 10/2007 | Sax |
| 2002/0002991 | A1 | 1/2002 | Lindner |
| 2002/0050244 | A1 | 5/2002 | Engesser |
| 2002/0055267 | A1 * | 5/2002 | Siniaguine et al. ........... 438/758 |
| 2002/0108851 | A1 * | 8/2002 | Woodruff et al. ............. 204/242 |
| 2004/0020427 | A1 | 2/2004 | Langen |
| 2004/0023494 | A1 * | 2/2004 | Aegerter et al. .............. 438/689 |
| 2004/0094186 | A1 | 5/2004 | Ivanov |
| 2004/0140536 | A1 | 7/2004 | Hidaka et al. |
| 2004/0241998 | A1 * | 12/2004 | Hanson ......................... 438/689 |
| 2006/0154066 | A1 | 7/2006 | Kita |
| 2006/0270193 | A1 | 11/2006 | Hidaka et al. |
| 2007/0000527 | A1 | 1/2007 | Aegerter et al. |

FOREIGN PATENT DOCUMENTS

| | | |
|---|---|---|
| WO | 97/45862 | 12/1997 |

OTHER PUBLICATIONS

Written Opinion mailed by the Australia Patent Office on Sep. 22, 2008 in Singapore patent application No. SG 200806207-7.

Office Action dated Mar. 8, 2010 issued in Taiwan Application No. 096106289.

EPO Communication dated Mar. 5, 2010 in EP application No. 07757232.9-2222.

Non-final Office Action dated Apr. 29, 2010 in U.S. Appl. No. 11/782,159.

Search and Examination Report mailed May 27, 2010 in Singapore Patent Application No. 200806207-7.

Non-final Office Action mailed Jun. 4, 2010 in U.S. Appl. No. 11/678,931.

* cited by examiner

SINGLE SIDE WORKPIECE PROCESSING

This application is a continuation-in-part of U.S. patent application Ser. No. 11/075,099, filed Mar. 8, 2005 and now pending, and claiming priority to U.S. Provisional Patent Application No. 60/552,642, filed Mar. 12, 2004. These applications are incorporated herein by reference.

BACKGROUND OF THE INVENTION

Remarkable progress made in microelectronic devices over the past several years has led to more useful yet less expensive electronic products of all types. It has also led to entirely new types of products. A major factor in the development of microelectronic devices has been the machines and methods used to manufacture them. Manufacturing of microelectronic devices requires extreme precision, extremely pure materials, and an extremely clean manufacturing environment. Even microscopic particles can cause defects and failures in devices.

Microelectronic devices are typically manufactured on a front or device side of a semiconductor wafer. In general, no microelectronic devices are on the back side of the wafer. However, contaminants on the back side of the wafer, such as metal particles, residues, films, etc., if not removed, can result in damage to devices on the front side of the wafer. For example, certain metals used in the manufacturing process, such as copper, can migrate through the wafer, from the back side to the front side, where they can cause defects in the microelectronic devices. Processing the backside of the wafer is therefore important.

The back side of the wafer may be processed using existing techniques, to remove contaminants. These techniques involve applying process fluids onto the back side, usually while spinning the wafer. However, the process fluids may damage microelectronic devices if the process fluids contact the front side of the wafer. Therefore, during back side processing, or single side processing in general, the process fluids should ideally make minimal or no contact with the front side or opposite side of the wafer. As the process fluids include liquids, gases or vapors, and as the wafer is usually spinning when they are applied, this objective has largely not yet been reached with current wafer processing technology.

Wafer processing machines have used various designs to try to solve the problem of how to exclude process fluids from the front side while processing the back side. Some of these machines have used flows of inert gas to try to confine the process fluids only to the back side. Others have used gaskets, membranes, or other types of mechanical seals or barriers to keep the process fluids off of the top side of the wafer. However, in the machines using gas flow, some amounts of process fluids tend to still reach the top side of the wafer. In the machines using mechanical seals, the seal must physically touch the top side of the wafer. This physical touching may damage microelectronic devices. Consequently, use of seals or physical barriers can have serious disadvantages.

Physical contact with the wafer by seals, fingers, clamps or other sealing, holding or positioning elements, as often used in current processing machines, creates risk of contamination via particle generation or particle release. These types of elements can also disrupt the uniform flow of process fluids on the wafer, resulting in varying degrees of processing at different areas of the wafer. Accordingly, regardless of whether one side or both sides are processed, minimizing physical contact with wafer generally provides better results. On the other hand, the wafer must be properly positioned and secured in place during processing. Accordingly, better machines and methods are needed to provide single side wafer processing, and for processing generally with less physical contact with the wafer.

SUMMARY OF THE INVENTION

New processing machines and methods for solving these difficult wafer back side processing and physical wafer contact problems have now been invented. These machines and methods provide dramatic improvements in manufacturing microelectronic and similar devices. In one aspect of the invention, a circulating gas is provided on one side of the wafer. The circulating gas creates gas pressure and flow conditions that keep process fluids away from the front side, during processing of the back side of the wafer. Accordingly, the back side may be processed using a wide range of process chemicals, without risk of damage to microelectronic devices the front side.

The circulating flow of gas may also hold the wafer in place during processing, via gas pressure forces. The gas flow and pressure conditions created by the circulating gas can exert holding forces at the edges of the wafer, while applying relatively little or no forces towards the unsupported central area of the wafer. The wafer is accordingly held securely in place during processing, with minimal stress applied to the wafer. Physical contact with the wafer during processing of the front side or the back side, or both, is minimized. This reduces potential for contamination and increases wafer yield. As a result, more useable device chips may be produced from each wafer.

A wafer processing machine using circulating gas may have a bowl having one or more process fluid inlets for applying a process fluid onto a first side of a wafer. The machine has a head which can be positioned in engagement with the bowl during workpiece processing. Rotational gas flow is created in a rotor supported on the head. One way of creating the rotational gas flow is by releasing pressurized gas in the rotor in directions at or near tangent to direction of rotation. The rotational gas flow holds the wafer in place on or in the rotor, with minimal physical contact with the wafer. The fluid inlets apply one or more process fluids onto the first side of the wafer, while the wafer rotates with the rotor. In addition to holding the wafer in place, for single side processing, the rotational gas flow in the rotor can also be used to exclude process fluids from the second side of the wafer. The wafer is positioned on the rotor with a gap around the edge of the wafer. Some or all of the circulating gas provided into the rotor escapes out through the gap and around the edge of the wafer. This outflow of gas prevents any of the process fluids applied to the first side from reaching the second side. The invention resides as well in sub-combinations of the machines and methods described.

BRIEF DESCRIPTION OF THE DRAWINGS

In the drawings, the same reference number indicates the same element, throughout the several views. Electrical wiring and gas and liquid plumbing lines are generally omitted from the drawings for clarity of illustration.

DETAILED DESCRIPTION OF THE DRAWINGS

The invention is directed to apparatus and methods for processing a workpiece, such as a semiconductor wafer. The term workpiece, wafer, or semiconductor wafer means any flat media or article, including semiconductor wafers and other substrates or wafers, glass, mask, and optical or memory media, MEMS substrates, or any other workpiece having micro-electronic, micro-mechanical, or microelectromechanical devices.

Figure 1:
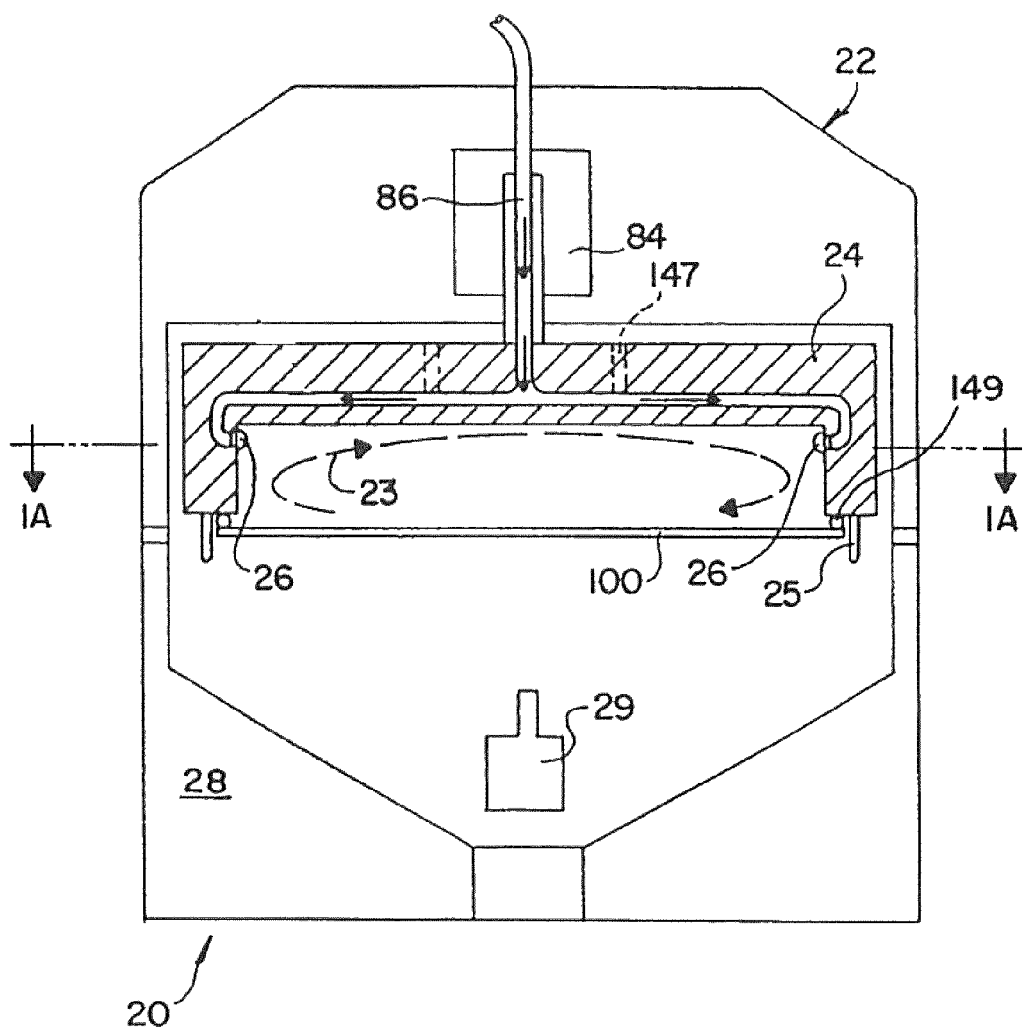
FIG. 1 is a section view showing principles of operation of the invention.

Turning to FIG. 1, a processor 20 may perform single side processing. Single side processing means applying one or more process fluids to only one side (referred to here as the back side) of the wafer, and with the process fluid substantially excluded from contacting the second (front) side of the wafer. The process fluid may optionally also contact the bevel edge of the wafer. The process fluid may be a liquid, a gas or a vapor. In FIG. 1, the processor 20 includes a rotor 24 linked to a spin motor in a head 22. Guide pins 25 may be provided around a perimeter of the rotor 24, to help guide a wafer 100 into position. Gas nozzles or inlets 26 spray or jet out gas in a direction which creates a gas vortex flow in the rotor 24. The arrows 23 in FIGS. 1 and 1A indicate the direction of gas flow. This gas flow creates a negative or lower pressure zone in the space above the wafer 100. As a result, pressure forces may be used hold the wafer 100 onto the rotor 24.

Referring to FIG. 1, the rotor 24 may be designed so that the only escape path for the gas is the annular opening between the edge of the wafer and the rotor. In this design, as the gas escapes or flows out of the rotor 24, the gas substantially prevents the wafer 100 from touching the rotor 24. The wafer is essentially be supported on, or held up by, a cushion of moving gas. The guide pins 25 may be provided to minimize or limit any side-to-side movement of the wafer in the rotor 24.

Referring still to FIG. 1, the head 22 may be placed in or moved into alignment or engagement with a base or bowl 28. Process fluids are applied onto the back side of the wafer from one or more nozzles or inlets 29 in the bowl 28. During processing, the motor 84 spins the rotor 24. The wafer 100 spins with the rotor 24. Process fluids are applied to the back side of the wafer. In FIG. 1, the back side is the down facing side. The gas flow escaping from the rotor 24 acts as an isolation barrier for the front side of the wafer. As the gas is constantly flowing outwardly, no process fluid can move into the rotor 24 or contact the top side of the wafer. Consequently, highly effective single side wafer processing may be achieved.

Figure 1A:
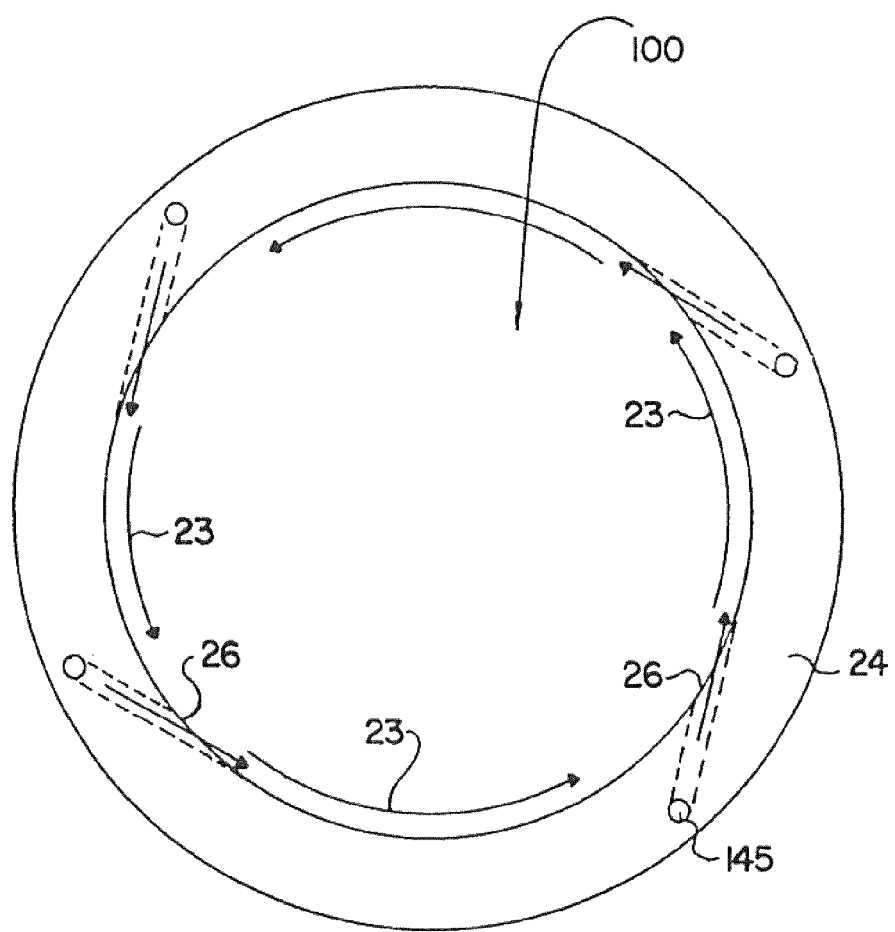
FIG. 1A is a section view taken along line 1A-1A of FIG. 1.

Referring now to FIGS. 1 and 1A, the gas flow is shown by the arrows 23. The rotor is designed to create a rotational gas flow. Near the inlets 26 (adjacent to the perimeter of the rotor), gas flow velocity is relatively high, and gas pressure is correspondingly relatively low. Towards or at the center of the rotor, gas flow velocity is relatively lower, and gas pressure is correspondingly higher. Consequently, pressure forces holding the wafer in place on the rotor are highest near the wafer edges (where the negative gas pressure is highest) and are lowest towards the center. Towards or at the center of the rotor, gas flow velocity may be at or close to zero. Thus gas pressure in the inner area of the rotor will typically be only slightly negative, neutral, or even slightly positive. As a result, the edge areas of the wafer can be securely held against the rotor, with minimum forces acting on the center of the wafer. Bending stresses on the wafer may therefore be reduced.

Figure 1B:
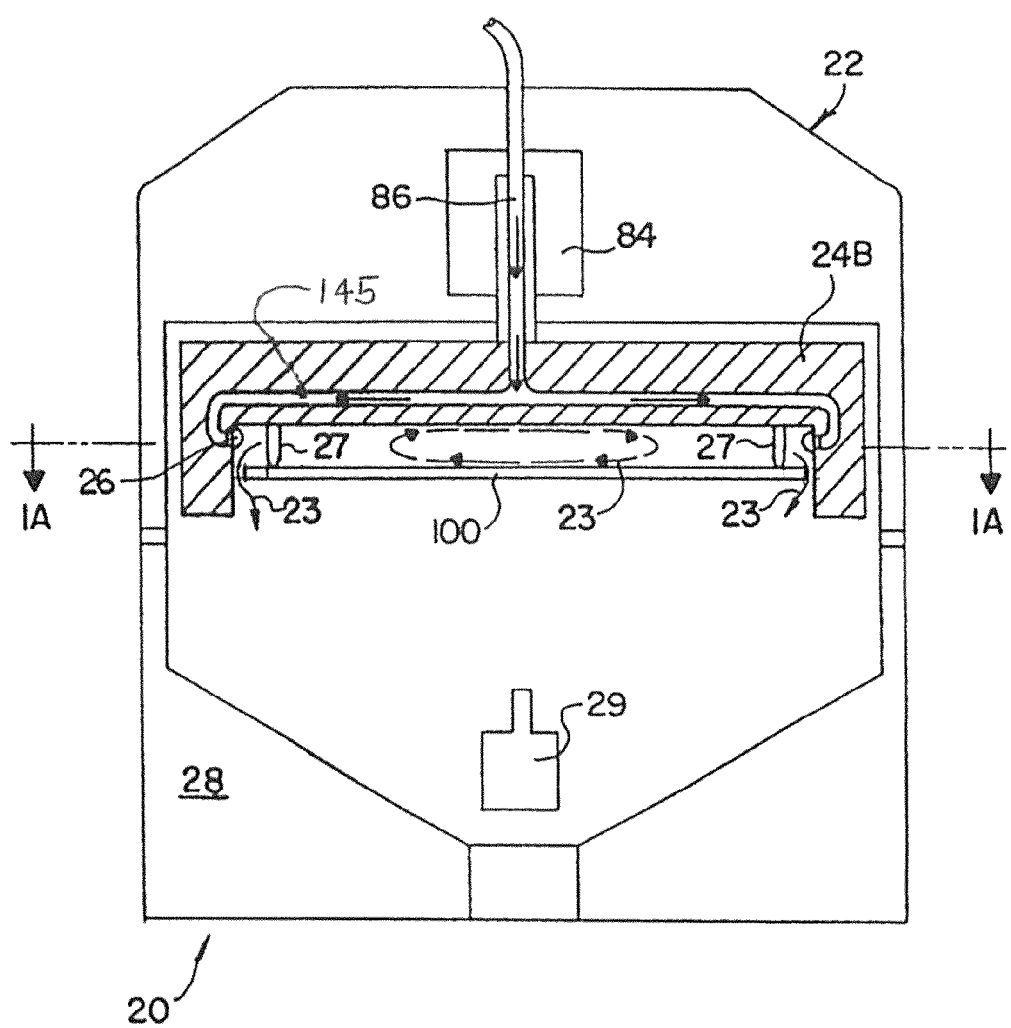
FIG. 1B is a section view of an alternative design.
Figure 2:
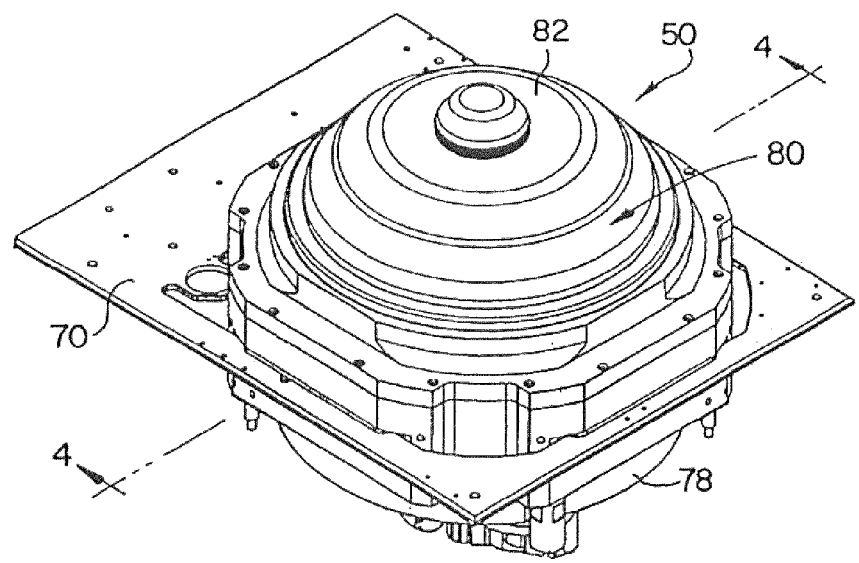
FIG. 2 is a top perspective view of a workpiece processor.

FIG. 1B shows a design where the rotor 24B has a diameter larger than the wafer 100. In this design, the wafer is entirely within the rotor 24B. The rotor 24B operates in the same way as the rotor in FIGS. 1 and 1A. However, the wafer is held away from the face of the rotor 24B by standoffs or pins 27. In this design, guide pins 25 are not needed, as the cylindrical side walls of the rotor prevent the wafer 100 from shifting excessively off center.

In each of the designs described here, the way that the gas escapes from the rotor may vary. In FIG. 1, gas escapes out through the annular opening between the edge of the wafer and the rotor. In the design shown in FIG. 1B, the gas escapes out through the annular gap between the edge of the wafer and the cylindrical side walls of the rotor. However, other gas escape openings may be used, alone or in combination with the opening and gap shown in FIGS. 1 and 1B. For example, gas outlets 147 shown in dotted lines in FIG. 1 may be provided in the rotor. The gas outlets 147 may be holes, slots, or other openings. The gas outlets 147 may be located anywhere on the rotor, and take any form which will facilitate the rotational gas flow described above.

With some processes and wafers, seals making physical contact with the wafer may be used. In these applications, a contact sealing element, such as a seal ring 149 shown in FIG. 1, may also be used to provide a physical seal between the rotor and wafer during processing. The negative pressure or vacuum conditions described above hold the edges of wafer securely against the seal ring 149. Gas outlets 147 in the rotor provide an escape path for the gas flow. The positioning pins 25 can be omitted since the wafer is held in physical contact with the seal ring, largely preventing any shifting of the wafer during processing.

Figure 6:
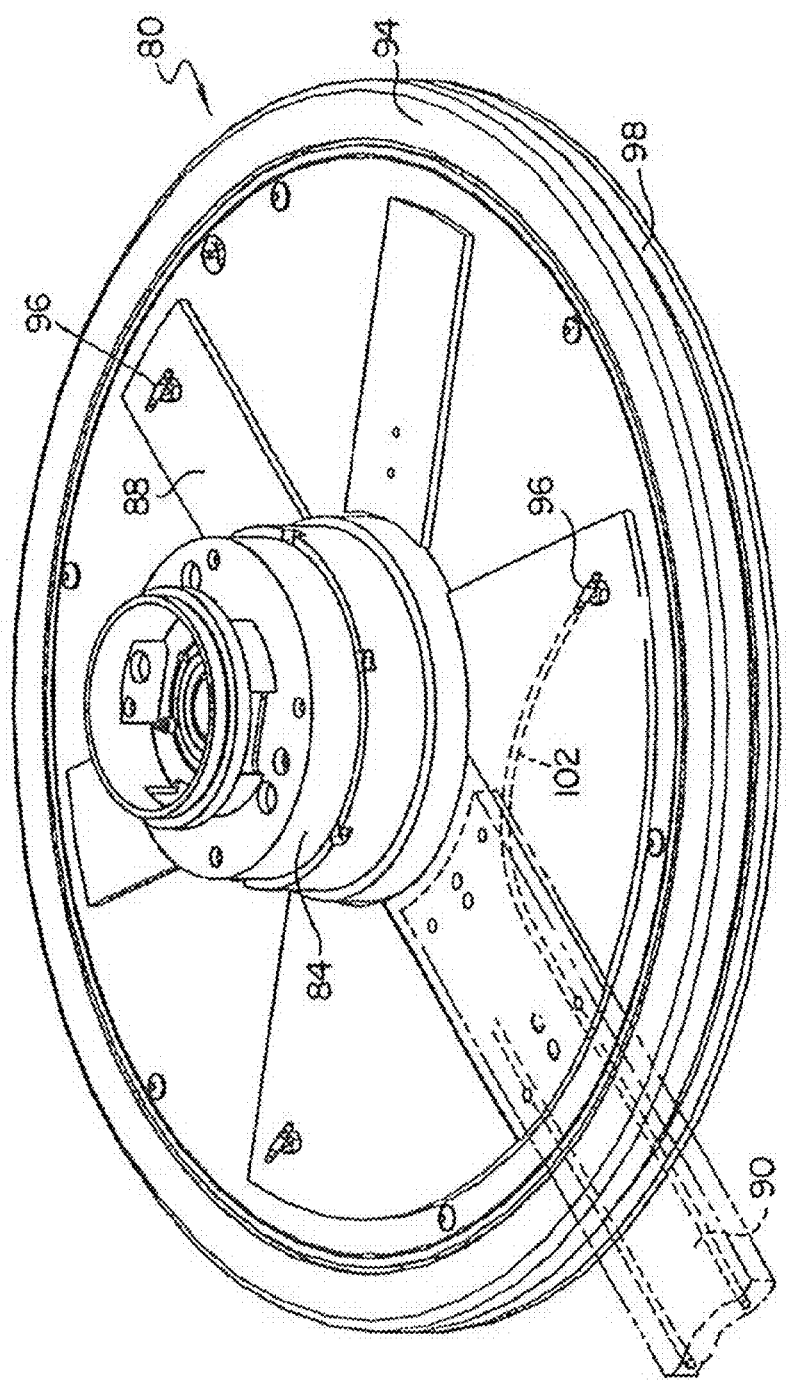
FIG. 6 is a top perspective view of the head shown in FIGS. 2-5, with the cover removed for illustration.
Figure 7:
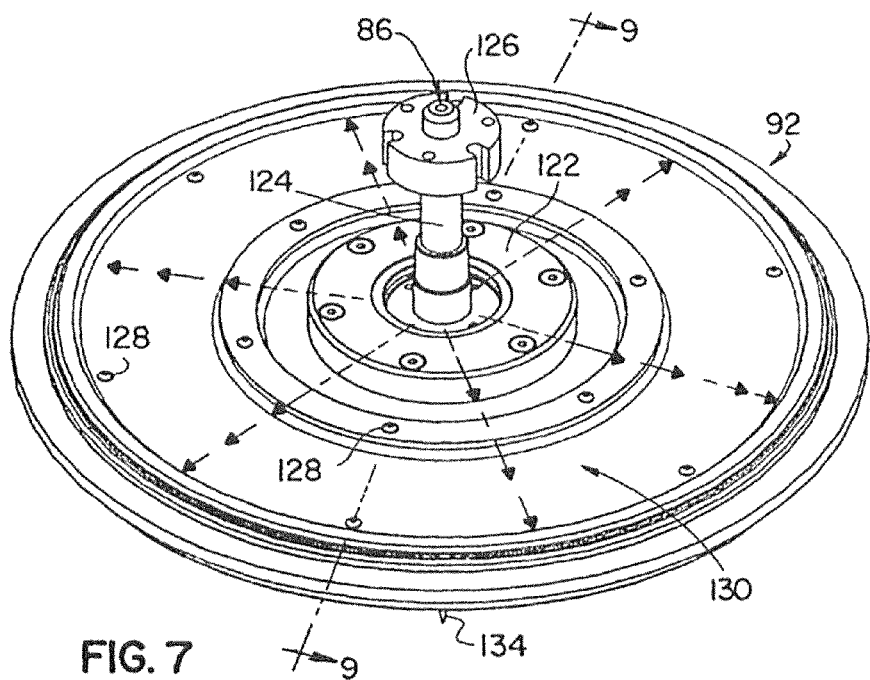
FIG. 7 is a top perspective view of the rotor shown in FIGS. 4 and 5.

FIGS. 2-5 show an example of a processor 50 which may use the principles of operation described above relative to FIG. 1. However, FIGS. 2-5 show various additional elements which are not essential to the invention. As shown in FIGS. 2-5, the processor 50 includes a head 80 and a bowl 78. The bowl 78 may be supported on a mounting plate 70 which in turn may be attached to the deck 52. As shown in FIGS. 6 and 7, a spin motor 84 may be supported on a base plate 88 of the head 80, and covered by a head cover 82. A rotor 92 is typically driven by the spin motor 84 and spins within the head 80. However, the motor 84 can be omitted in favor of other techniques used to spin the rotor.

The head 80 is engageable with the bowl 78. Specifically, for processing, the head 80 may be moved to a position adjacent to (but not contacting) the bowl 78, or the head 80 may be physically contacting with the bowl 78, or even sealed against the bowl 78, as shown in FIG. 4.

Figure 4:
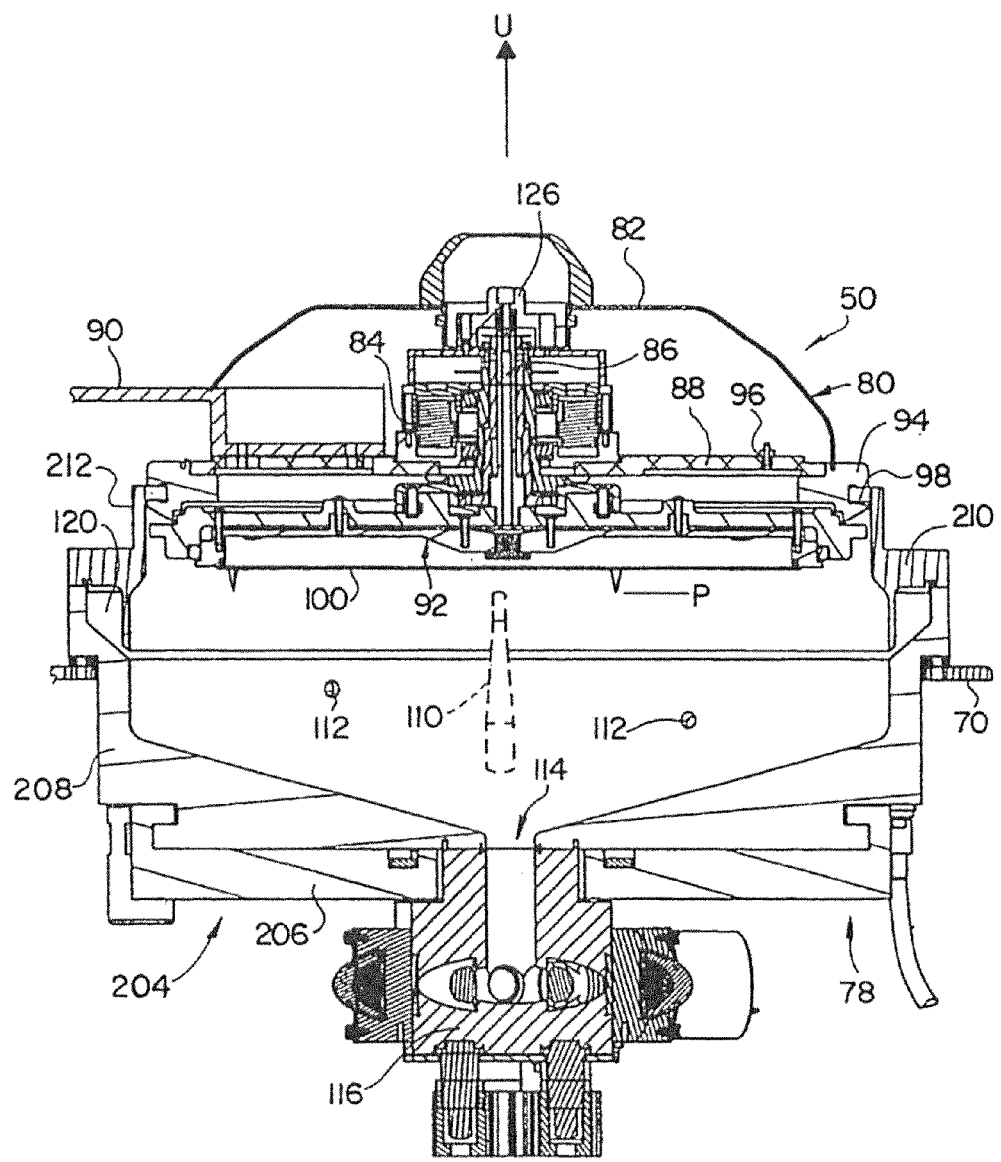
FIG. 4 is a section view taken along line 4-4 of FIG. 2.
Figure 5:
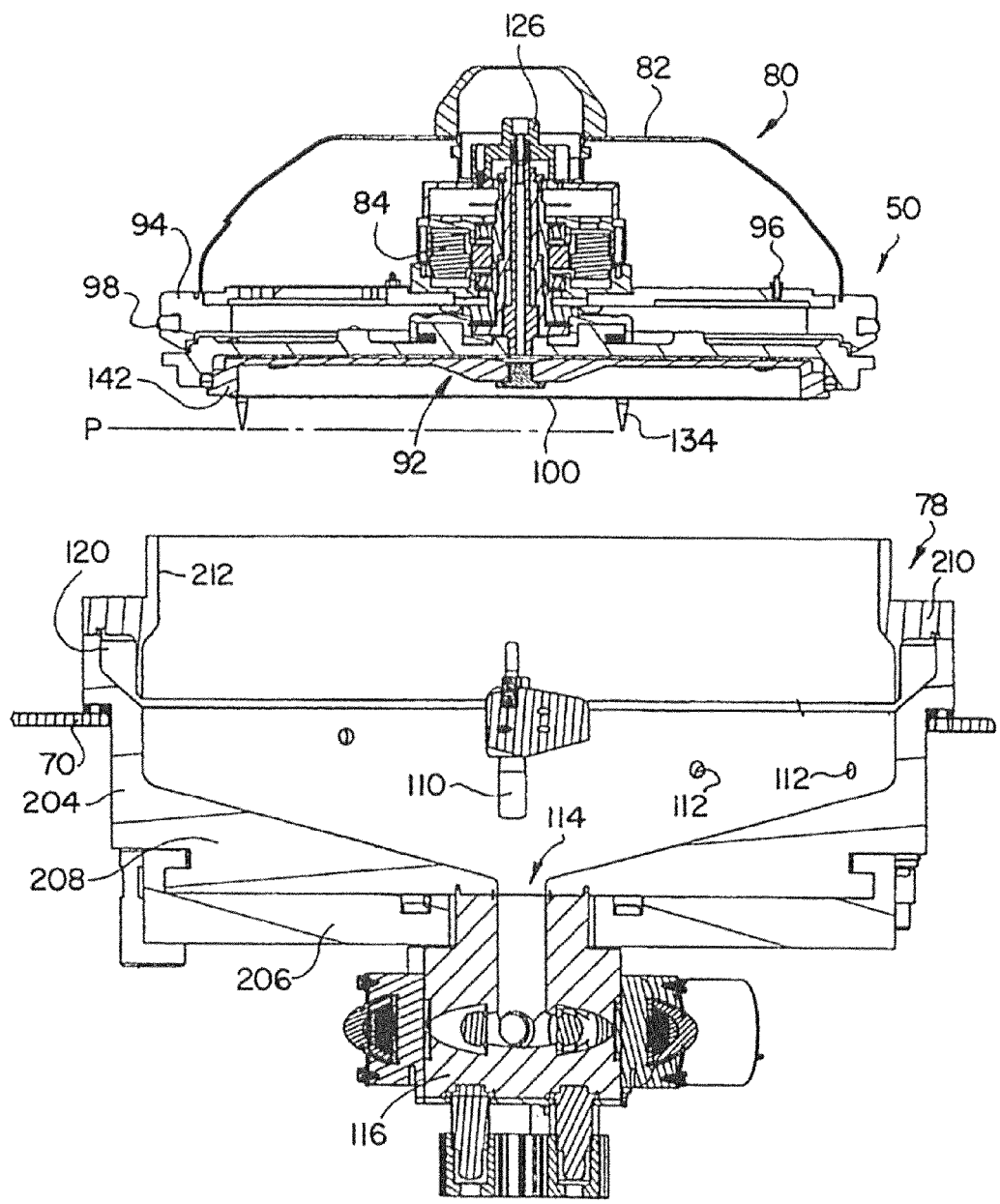
FIG. 5 is a section view of the processor as shown in FIG. 3.

As shown in FIGS. 4 and 5, the bowl 78 has liquid spray nozzles or inlets 112, for applying a process liquid onto the back or down facing surface of a workpiece 100 held in the head 80. The nozzles or inlets 112 may be fixed in position on the sides or bottom surfaces of the bowl 78. Alternatively, some or all of the nozzles 112 may be moving, e.g., on a swing arm. Combinations of fixed and moving nozzles 112 may also be used. Fixed or moving spray manifolds having multiple nozzles or inlets, may also be used in the bowl 78. Gases or vapors may also be applied to the workpiece 100 via the nozzles 112. A drain 114 collects spent process fluid for removal from the bowl 78. One or more valves 116 may be associated with the drain 114. Bowl stand-offs 110, if used, are attached to the bowl and project upwardly from the bowl 78 towards the workpiece 100 on the head 80. As shown in FIG. 5, the head 80 may be lifted vertically away from the bowl 78 by a head lifter (not shown) connected to the head by a head lifting arm 90, shown in FIG. 4.

FIG. 6 shows the head 80 with the cover 82 and other components removed for illustration. Head gas supply lines 102 advantageously deliver gas or clean dry air to gas ports 96 passing through the base plate 88, to provide a flow of gas between the base plate 88 and the rotor 92. This flow of head gas or clean dry air helps to prevent migration of process liquids, vapors, or gases into the head 80, thereby reducing corrosion of head components. A head ring 94 may be attached around the outside of the base plate 88. An inflatable seal 98 may be provided in a groove in the head ring, to seal the head 80 against the bowl 78 during processing. The components shown in FIG. 6 which are part of the head 80, are supported by the head lifting arm 90, and do not rotate.

Figure 8:
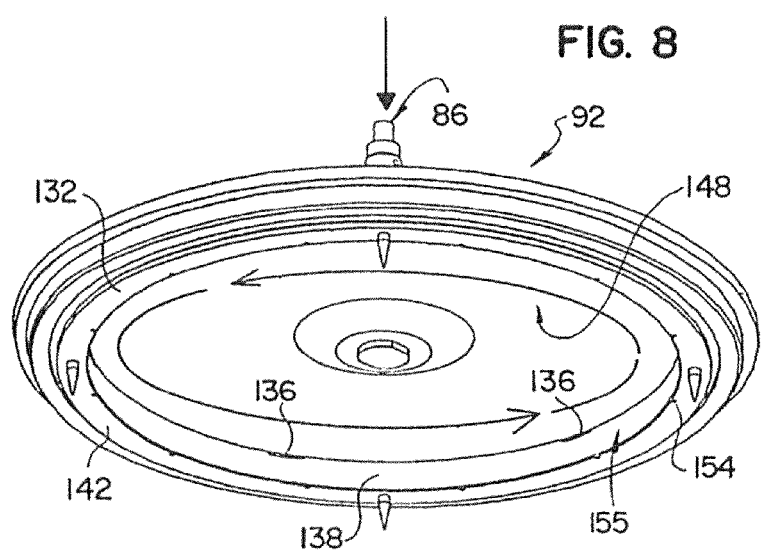
FIG. 8 is a bottom perspective view of the rotor shown in FIG. 7.
Figure 9:
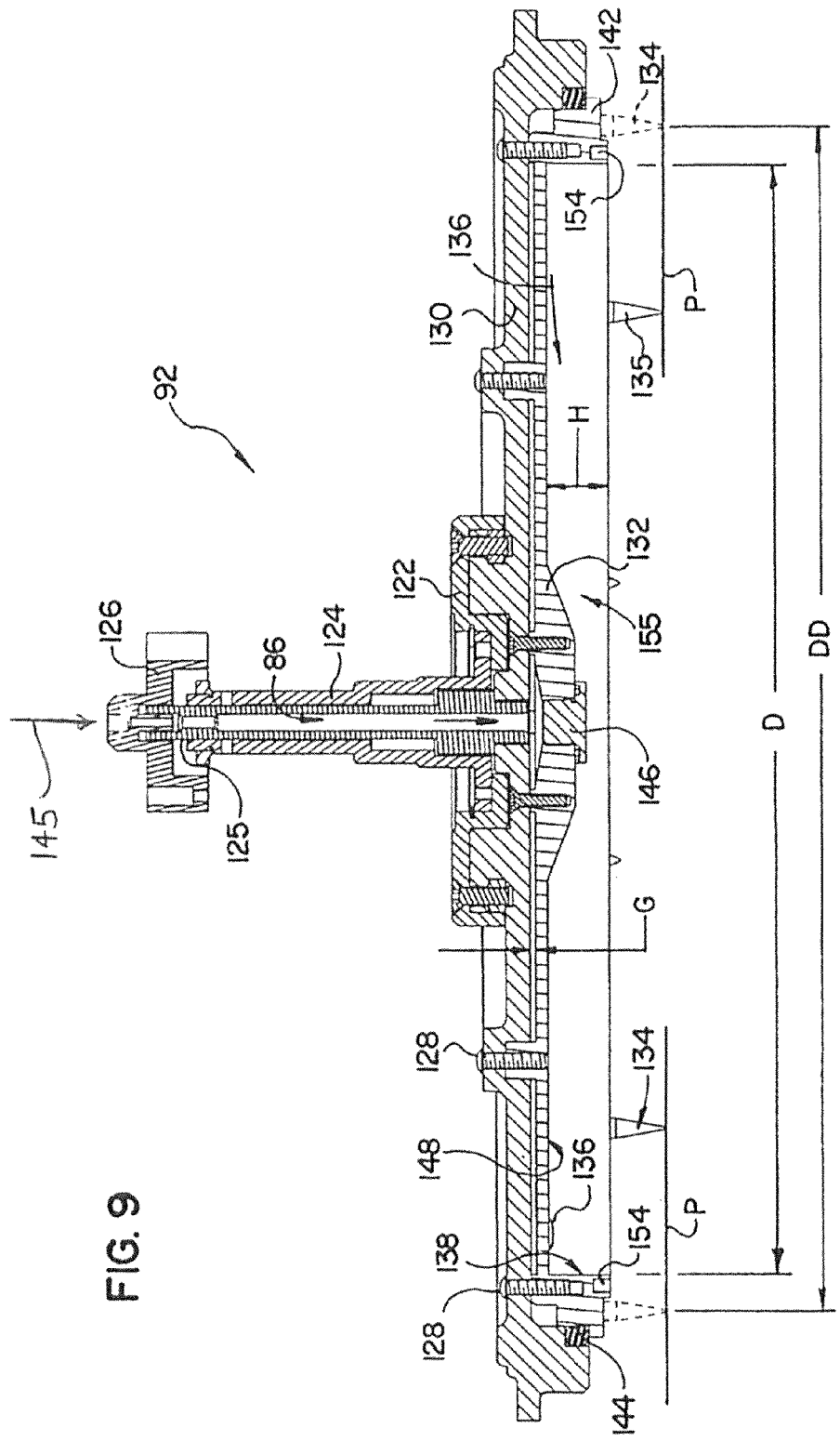
FIG. 9 is a section view taken along line 9-9 of FIG. 7.

Turning now to FIGS. 7, 8 and 9, in the example shown, the rotor 92 has a drive plate 130 attached to a shaft 124 at a hub 122. The shaft 124 is keyed to the spin motor 84 in the head 80. A chuck 132 is attached to the drive plate 130 by screws 128 or other fasteners. As shown in FIGS. 8 and 9, guide pins 134 extend out (or downwardly) from an outer rim 142 of the chuck 132. The guide pins 134 may have a conical or tapered section 135. As shown in FIG. 9, contact pins 154 project slightly from the chuck outer rim 142. The contact pins 154 are shorter than the guide pins 134 and are positioned radially inside of the guide pins 134.

Referring still to FIG. 9, the chuck 132 has a cylindrical side wall 138 joined, typically substantially perpendicularly, to a top or web plate 148. An O-ring or other seal 144, if used, seals the outer surface or perimeter of the chuck 132 against the drive plate 130. The web or top plate section 148 of the chuck 132 is generally spaced apart from the drive plate 130 by a gap G (except at the fastener 128 attachment points).

A gas flow path generally designated 145 and indicated by the arrows in FIGS. 7-9 extends through the rotor 92. A supply of gas, such as nitrogen, or clean dry air, under pressure, connects from a supply line in the head 80, through a labyrinth cap 126 (shown in FIGS. 4, 5 and 7) attached to the motor housing and into an inlet line 86 extending through a sleeve 125 within the shaft 124. The sleeve 125 is attached to the drive plate 130 and rotates within the cap 126.

Gas provided to the head 80 flows (downwardly in the design shown) through the inlet line 86, as shown in FIG. 9, radially outwardly in the gap G, as shown in FIGS. 7 and 9, to gas inlets 136. The gas inlets 136, located in the side wall 138 of the chuck 132 are positioned to jet or spray gas in a direction fully or at least partially tangent to the cylindrical side wall 138. The inlets are oriented so that the gas direction is tangent to the sidewalls, or within 40, 30, 20 or 10 degrees of tangent. Multiple gas inlets 136, for example, 3, 4, 5, 6, 7 or 8 gas inlets 136 are advantageously radially spaced apart and positioned in the side wall 138, close to the top or web 148 of the chuck 132. The number, shape, configuration, and location of the gas inlets 136 may of course be changed, as various designs may be used to create gas flow conditions which will cause the workpiece 100 to be held in place on the rotor 92. The O-ring or seal 144 may be used to prevent gas from escaping from the gas flow path 145, except through the gas inlets 136.

The side walls 138 of outer rim 142 on the chuck plate 132 form a space generally designated 155 in the chuck 132 having a diameter D, and a depth or height H, as shown in FIG. 9. The dimension H is substantially uniform, except at the central area around the hub 122.

A central opening may be provided in the chuck plate 132 for alignment purposes. If used, the opening is closed via a plug 146 before the rotor 92 is put into use. Referring now to FIGS. 8 and 9, the guide pins 134 are positioned on a diameter DD slightly larger than the diameter of the workpiece 100 (which in turn is slightly larger than the diameter D of the cylindrical or disk-shaped space 155). Accordingly, with a workpiece placed into the rotor 92, as shown in FIG. 4, there is only nominal radial or lateral clearance between the guide pins 134 and the edge of the workpiece.

Figure 3:
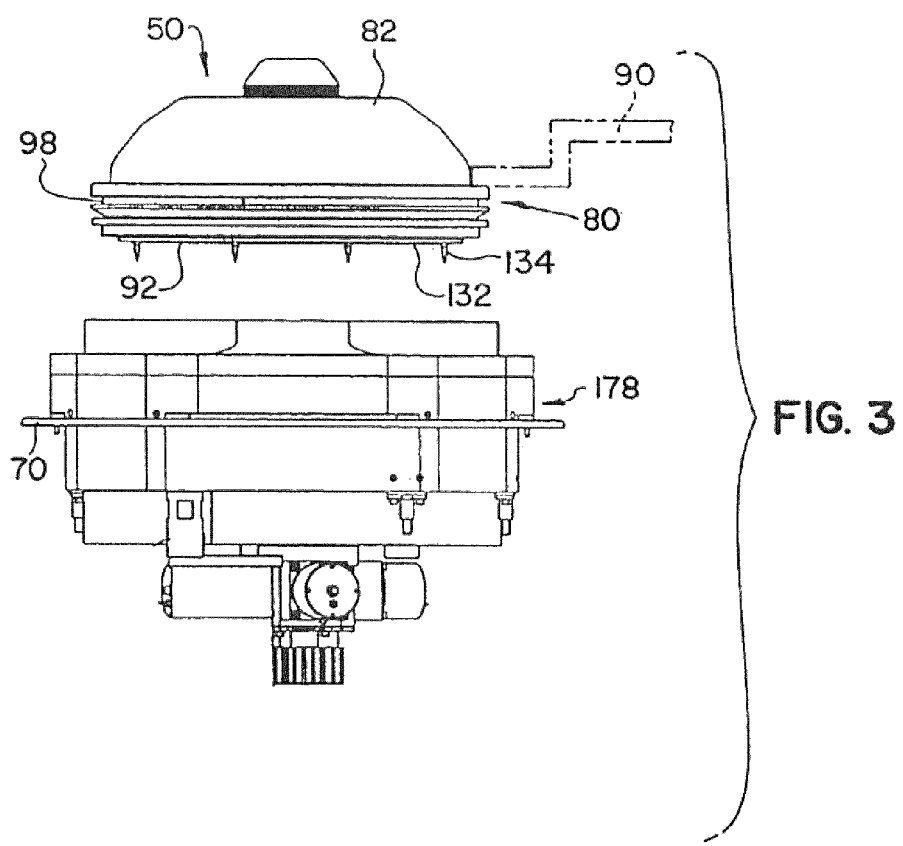
FIG. 3 is a side view of the processor shown in FIG. 2, in an open or load/unload position.
Figure 11:
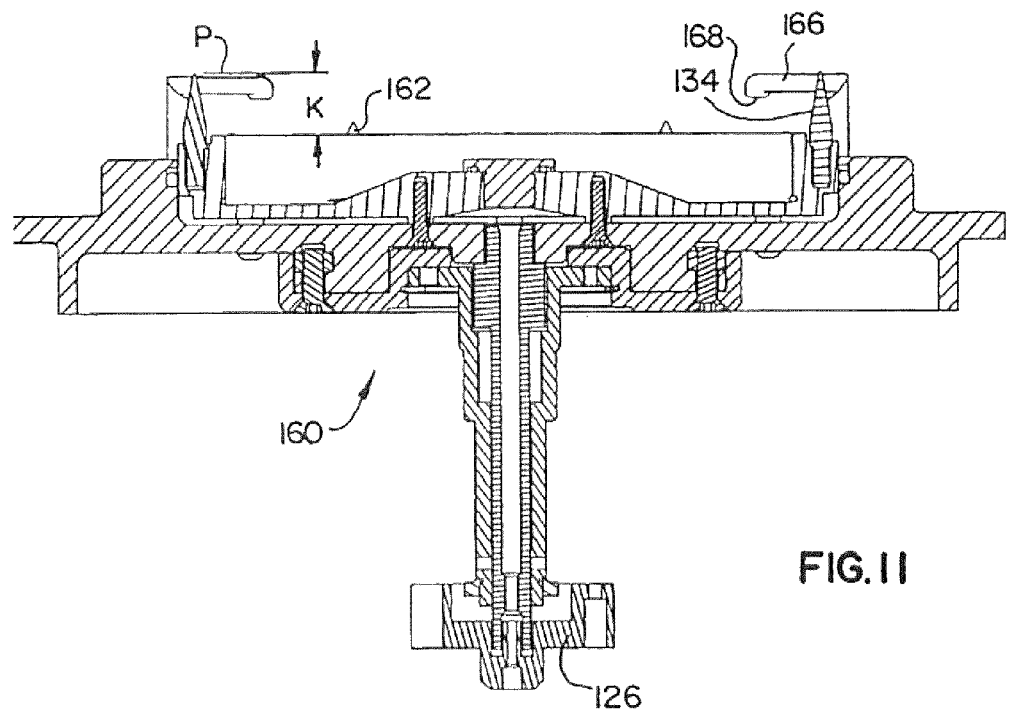
FIG. 11 is a section view taken along line 11-11 of FIG. 10

Referring to FIG. 3, the processor 50 is in the up or open position for loading and unloading. In the design shown, the head lifting arm 90 lifts the head 82 up from the bowl 78. A workpiece 100 is moved into a position between the head 82 and the bowl 78, with the workpiece 100 generally aligned with the rotor 92. The workpiece is then moved vertically upwardly, with the guide pins 134 around the outside edge of the workpiece. The workpiece at this point is at or above the plane P of the guide pins 134, as shown in FIG. 11. These workpiece loading movements may be performed manually, or by a robot, as further described below.

Gas is then supplied to the gas flow path 145. Referring momentarily to FIG. 8, due to the generally tangential orientation of the gas inlets 136 and the relatively high velocity of the gas flowing out of the inlets 136, a rotational gas flow or vortex is created within the space 155, between the workpiece and the top plate 148 of the chuck 132. The gas flows in a circular pattern in the space 155. The gas may then move out of the space by flowing around the edge of the workpiece 100 and into the bowl 78. This creates a negative pressure or vacuum at the outer areas of the space 155, causing the workpiece to lift up and off of the robot 44. The negative pressure in the outer areas space 155 above the workpiece 100 holds the top surface of the workpiece against the contact pins 154. This prevents the workpiece from rotating or shifting relative to the rotor 92. The contact pin 154 may have a spherical end which essentially makes point contact with the wafer. Alternatively, the contact pin may have an end that makes contact over a very small area, e.g., over a diameter of 0.2-3 mm.

The normal force acting to hold the workpiece 100 against the contact pins 154 depends on the pressure difference created by the vortex gas flow, and the surface area of the workpiece on which the pressure acts. The normal force may be adjusted by controlling the gas flow. In general, the normal force will significantly exceed the weight of the workpiece, so that the workpiece remains held against the contact pins 154, regardless of its orientation relative to gravity. The contact pins 154 which are the only surfaces supporting the workpiece, are generally positioned within 2-10, 4-8, or 5-7 mm of the edge of the workpiece.

The head lifter then lowers the head lifting arm 90 and the head 80, with the head moving from the open position shown in FIG. 5, to the closed or processing position shown in FIG. 4. The seal 98, if used, is inflated, creating a partial or full seal between the head 80 and the bowl 78.

The only escape path for the gas in the space 155 is the small annular opening between the workpiece and the rim 142 of the chuck 132. As gas escapes from the space 155, it tends to prevent the workpiece 100 from touching the chuck 132, or any part of the rotor 92 or processor 50, except for the contact pins 154. The workpiece 100 is otherwise essentially suspended within a flow of gas. The guide pins 134 act, if needed, to prevent the workpiece 100 from moving too far off center of the spin axis of the rotor 92. Ordinarily though, the gas flow around the edges of the workpiece, and the normal force holding the workpiece against the contact pins 154, will tend to keep the workpiece centered.

The spin motor 84 is turned on, spinning the rotor 92 and the workpiece 100. In general, the gas flow vortex spins within the rotor in the same direction as the rotor spins. Process liquid is sprayed or jetted from the nozzles or inlets 112 onto the bottom or down facing surface of the spinning workpiece 100. Process gases or vapors may also be used. Centrifugal force helps to distribute the process liquids over the entire bottom surface of the workpiece 100. The gas flow via the flow path 145 in the rotor 92 helps to prevent any process liquids or gases from contacting the top surface of the workpiece 100, as there is a constant flow of gas from the space above the workpiece to the space below the workpiece.

Following the application of process liquids and/or gases, the wafer may optionally be rinsed and/or dried, also while in the position shown in FIG. 4. When all processing within the processor 50 is completed, the workpiece 100 is unloaded following the reverse sequence of steps described above.

Interruption of the flow of gas to the rotor 92, while the rotor is holding a workpiece 100, could result in the workpiece 100 moving or falling out of the rotor 92. To reduce the potential for damage in this event, bowl stand off posts 110 are positioned in the bowl 78 and extend up to a position about 10-15 millimeters below the workpiece 100 (when in the processing position) as shown in FIG. 4. In the event of a gas flow interruption, the workpiece will drop only a short distance and come to rest on the stand-off posts 110.

After the gas moves out of the rotor 92, it is drawn into a gas exhaust plenum 120 and then removed from the processor 50. Depending on the specific processes to be run in the processor 50, the chuck 132 and drive plate 130 may optionally be made of corrosion resistant materials, such as PVDF plastic materials or equivalents. The rotor 92 as described above, and the entire head 80, may be used in virtually any centrifugal process where a process chemical, typically a liquid, is applied to one side only of a workpiece. While the processor 50 is shown in a vertical and upright position, it may also be used in other positions or orientations. Accordingly, the description here of top or bottom surfaces and up and down directions are provided to describe the examples shown in the drawings, and are not requirements or essential operating parameters.

In each of the embodiments described, the front or device side of the wafer may be facing towards or away from the rotor. For back side cleaning or processing, the wafer is placed into the rotor with device side facing the rotor. For front side cleaning or processing, the wafer is place into the rotor with the front side facing away from the rotor. The desired face up/face down orientation of the rotor may be achieved via robotic or manual handling. A separate inverting or wafer flipping station may also be used.

Generally, the gas provided to the rotor is inert, i.e., it does not significantly chemically react with the wafer. However, process chemical gases may be used in place of inert gases. Providing a process chemical gas to the rotor allows for chemically processing the side of the wafer facing the rotor, optionally while simultaneously processing the other side of the wafer with the same process chemical gas, or with a different process chemical gas or liquid.

As may be appreciated from the description above, the head 50 requires no moving parts for holding or securing the workpiece 100. Since gas flow is used to hold the workpiece in place, the head 80 may have a relatively simple design. In addition, generally, chemically compatible plastic materials may be used for most components. This reduces the need for metal components, which can lead to contamination. There are also no obstructions or components over or shadowing the workpiece 100. This allows distribution of process liquids onto the workpiece to be highly uniform, resulting in more consistent and uniform processing. The guide pins 134 only touch the edge of the workpiece. The contact pins 154 contact only very small areas of the front or top side of the workpiece 100. Consequently, touching the workpiece 100 is minimized.

Figure 10:
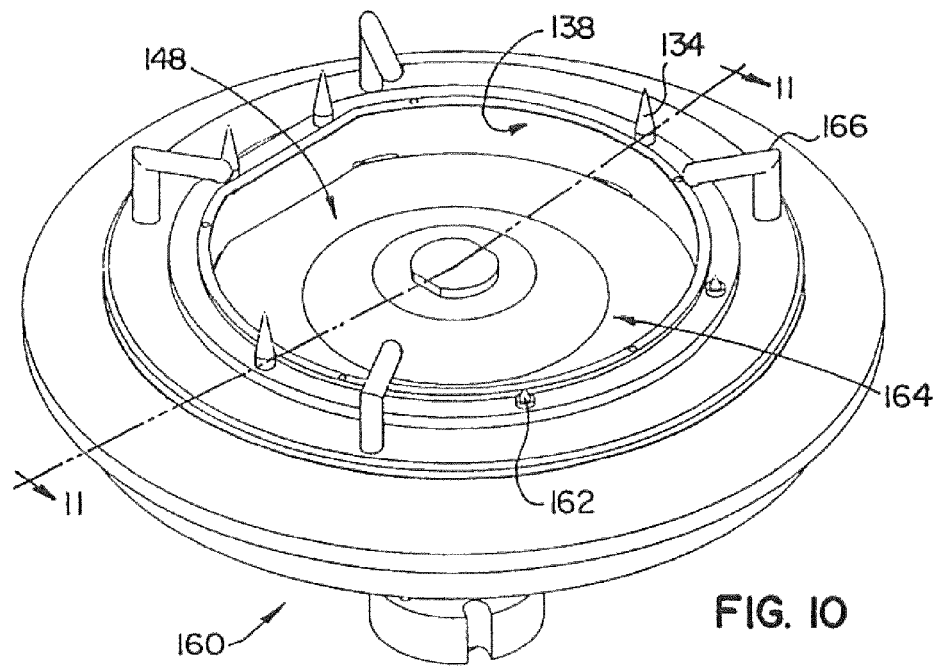
FIG. 10 is a bottom perspective view of an alternative rotor design.

FIGS. 10 and 11 show an alternative rotor 160. The rotor 160 is similar to the rotor 92, except for the differences described below. As shown in FIG. 10, on one side, the rotor 160 has short guide pins 162. The remaining guide pins 134 are full length guide pins, with the tip of the guide pin 134 extending by a dimension K beyond the rim 142 to the plane P. The full height guide pins 134 and workpiece holders 166 are spaced apart by dimensions greater than the diameter of the workpiece 100. L-shape workpiece holders 166 are attached to the drive plate 130 and have a horizontal leg extending radially inwardly. The short guide pins 162 create a entrance pathway 164, allowing a workpiece 100 to move laterally into the rotor 160 (in contrast to the vertical workpiece movement described above relative to the rotor shown in FIGS. 7-9. With lateral movement, the robot 44 can generally align the wafer 100 with the rotor 160, and then move down to place the workpiece 100 on the holders 166. The upfacing ends of each holder 166 preferably have a flat land area 168 for supporting the workpiece 100. The robot 44 can then withdraw to perform other functions within the system 30 even if the processor having the rotor 160 is not active. Accordingly, a workpiece 100 may be placed into the rotor 160 even when no gas is flowing through the rotor 160.

The rotor 160 shown in FIG. 11, in comparison to the rotor 92 shown in FIG. 9, is designed for handling smaller diameter workpieces. For example, the rotor 92 shown in FIG. 9 is designed for 300 mm diameter workpieces, while the rotor 160 shown in FIG. 11 is designed for 200 mm diameter workpieces. Of course, the rotor can be made in various other sizes as well for processing workpieces having other sizes.

Figure 12:
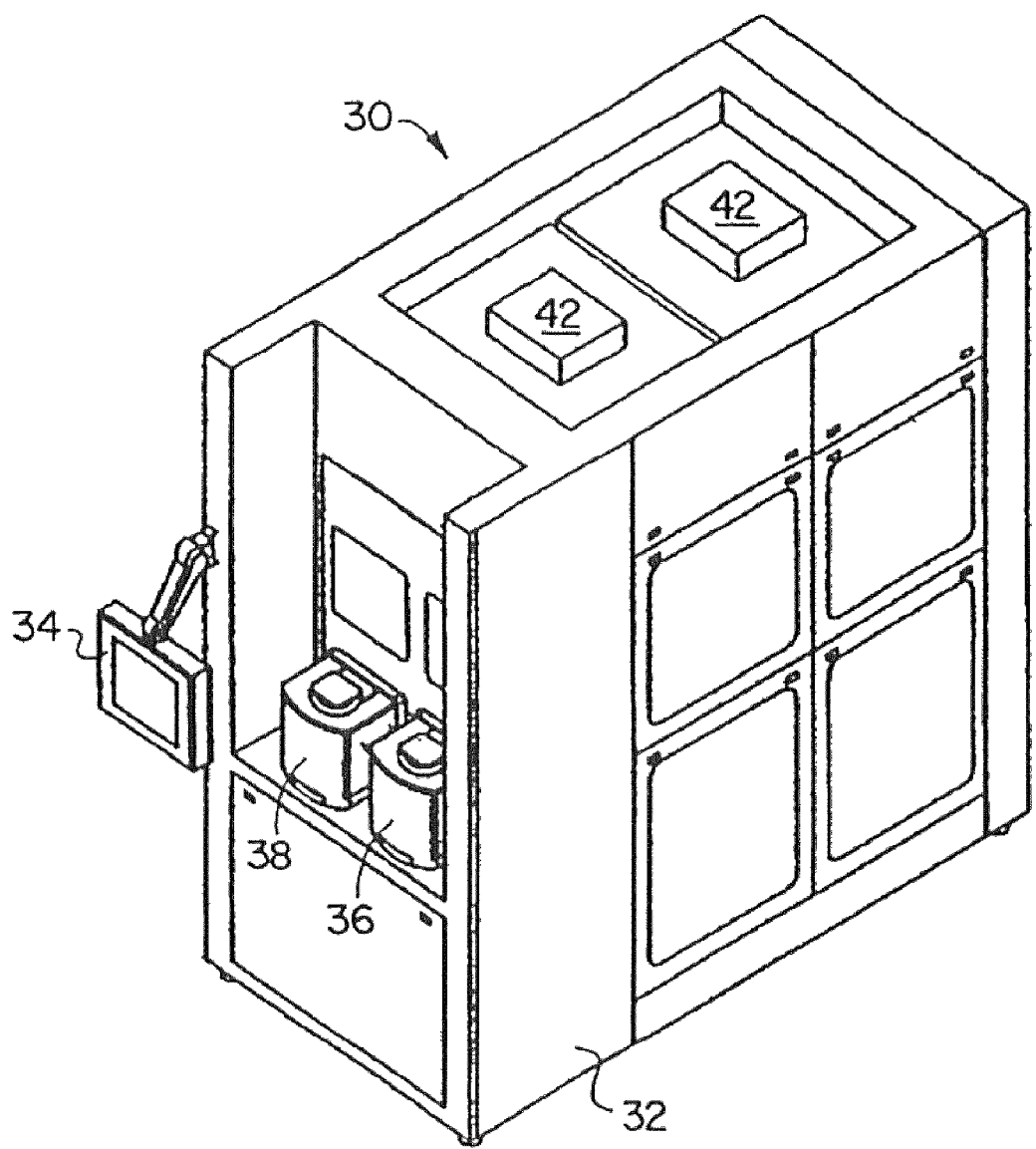
FIG. 12 is a perspective view of a workpiece processing system including several of the processors as shown in FIGS. 2-9.

The processors described above may be used in automated processing systems. An example of one processing system 30 is shown in FIG. 12. The processing system 30 generally has an enclosure 32, a control/display 34, and an input/output or docking station 36. Wafers or workpieces within pods or boxes 38 (e.g., FOUPs) are removed from the boxes 38 at the input/output station 36 and processed within the system 30.

Figure 13:
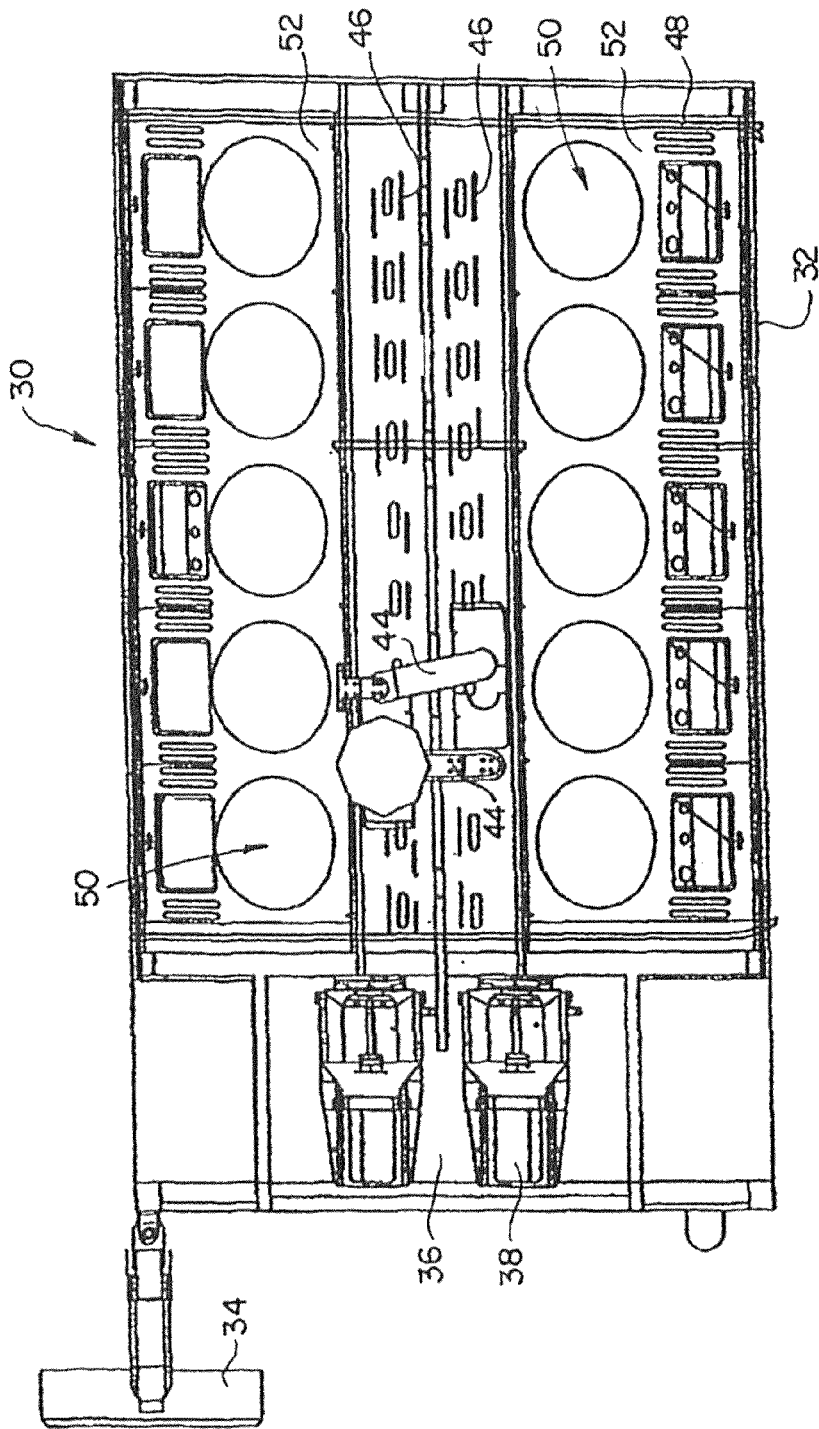
FIG. 13 is a plan view of the system shown in FIG. 12.

Turning to FIG. 13, the processing system 30 preferably includes a frame 48 that supports an array of workpiece processors 50 on a deck 52 within the enclosure 32. Facility or fab air inlets 42 are typically provided along with air filters, at the top of the system 30. Each workpiece processor 50 may be configured to process workpieces, such as 200 or 300 mm diameter semiconductor wafers or similar workpieces, which may be provided within sealed boxes 38, open cassettes, or other carriers or containers.

The frame 48 in FIG. 13 is shown supporting ten workpiece processors 50, but any desired number of processors 50 may be included. The frame 42 preferably includes one or more centrally located rails 46 between the processors 50. One or more robots 44 can move on the rails 46 to load and unload workpieces into and out of the processors 50.

Figure 14:
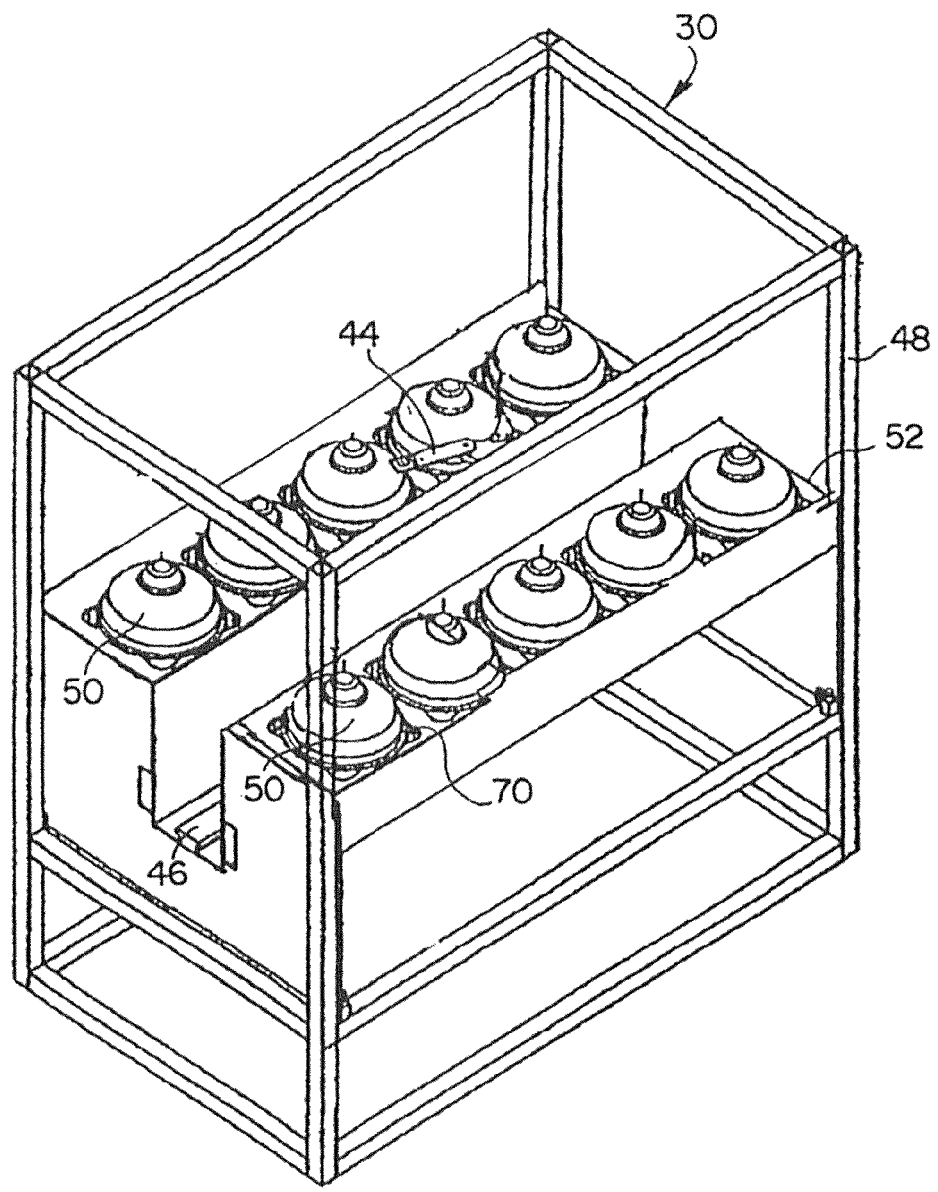
FIG. 14 is a perspective view of components or subsystems shown in FIG. 12.

Referring to FIGS. 12-14, in use, workpieces or wafers 100 are typically moved to the processing system 30 within containers 38 such as front opening unified pods (FOUPs) or similar closeable or sealable containers. Alternatively, open containers such as cassettes or other carriers may also be used. At the docking or input/output station 36, the door or cover of the container 38, if any, is removed, generally via a robotic or automated subsystem. The load port door or window in the enclosure 32, if any, is opened. The robot 44 removes a workpiece 100 from a container 38 and carries it to one of the processors 20 or 50. The workpiece 100 is then ready for loading into a processor. This sequence of steps, as well as the components or apparatus used in moving the workpiece 100 to the processor may of course vary, and are not essential to the invention. Rather, the sequence described above and as shown in FIGS. 12-14 represents an example, for purposes of explanation.

Figure 15:
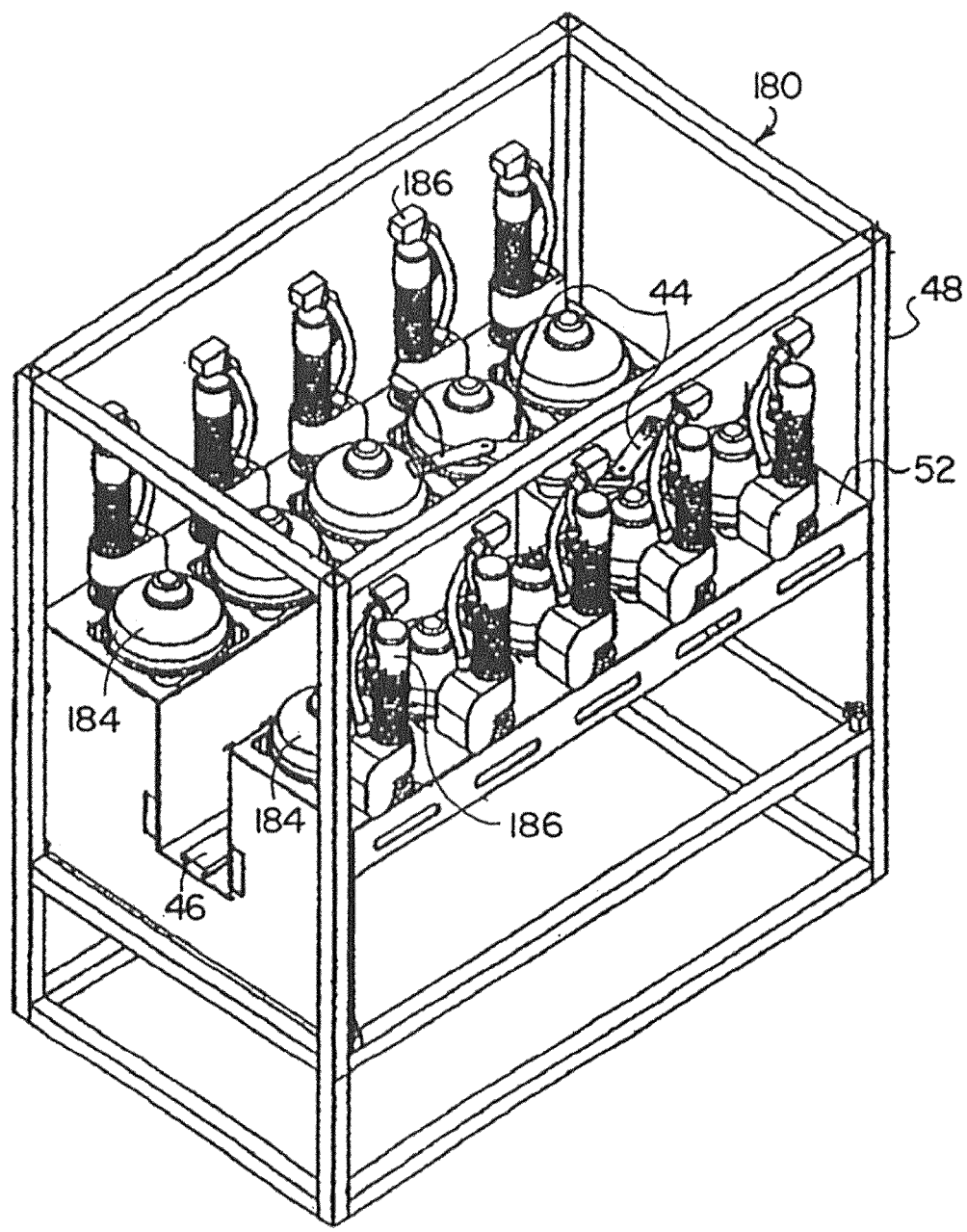
FIG. 15 is a perspective view of selected components and subsystems of an alternative processing system.
Figure 16:
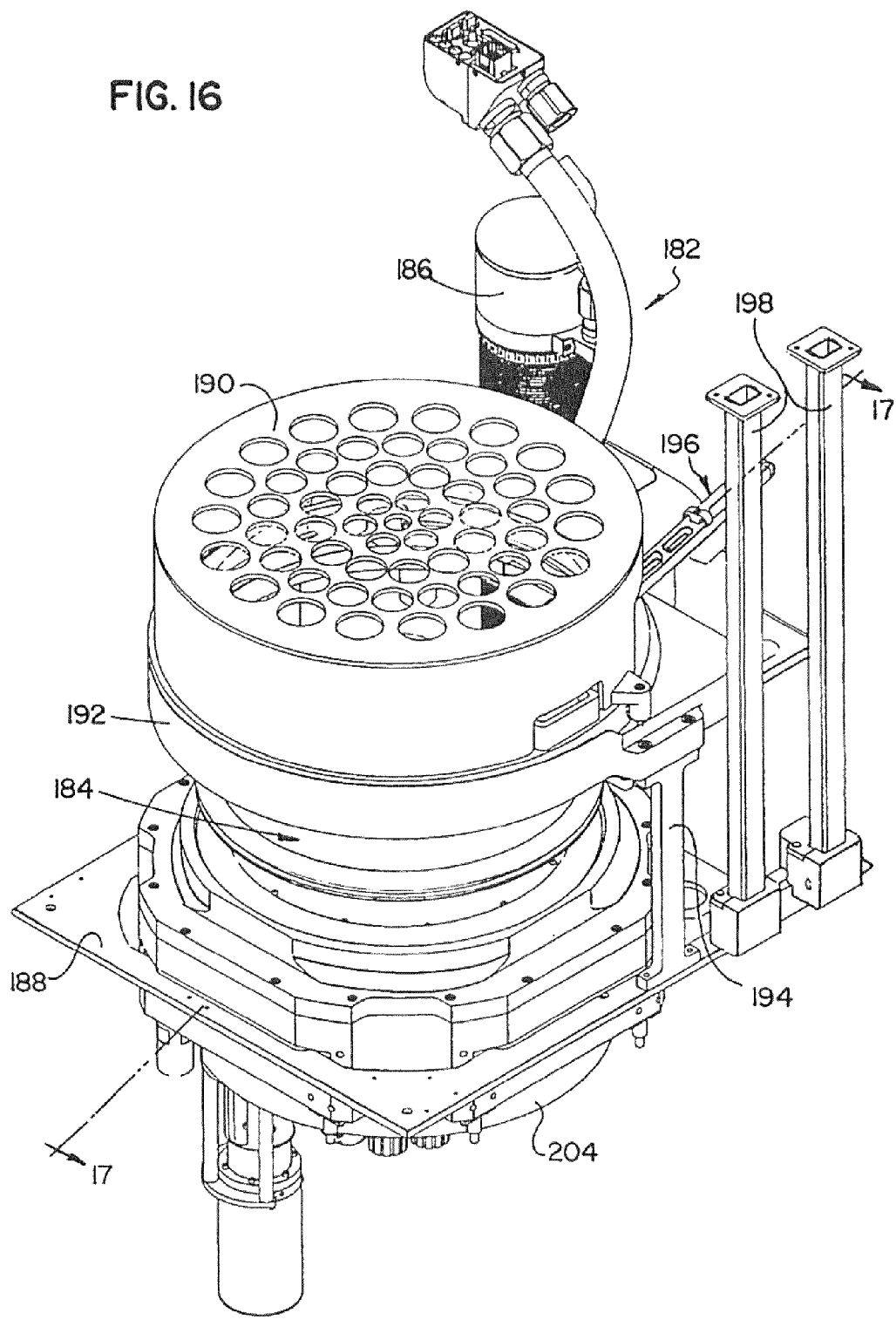
FIG. 16 is a perspective view of one of the processing assemblies shown in FIG. 15.
Figure 17:
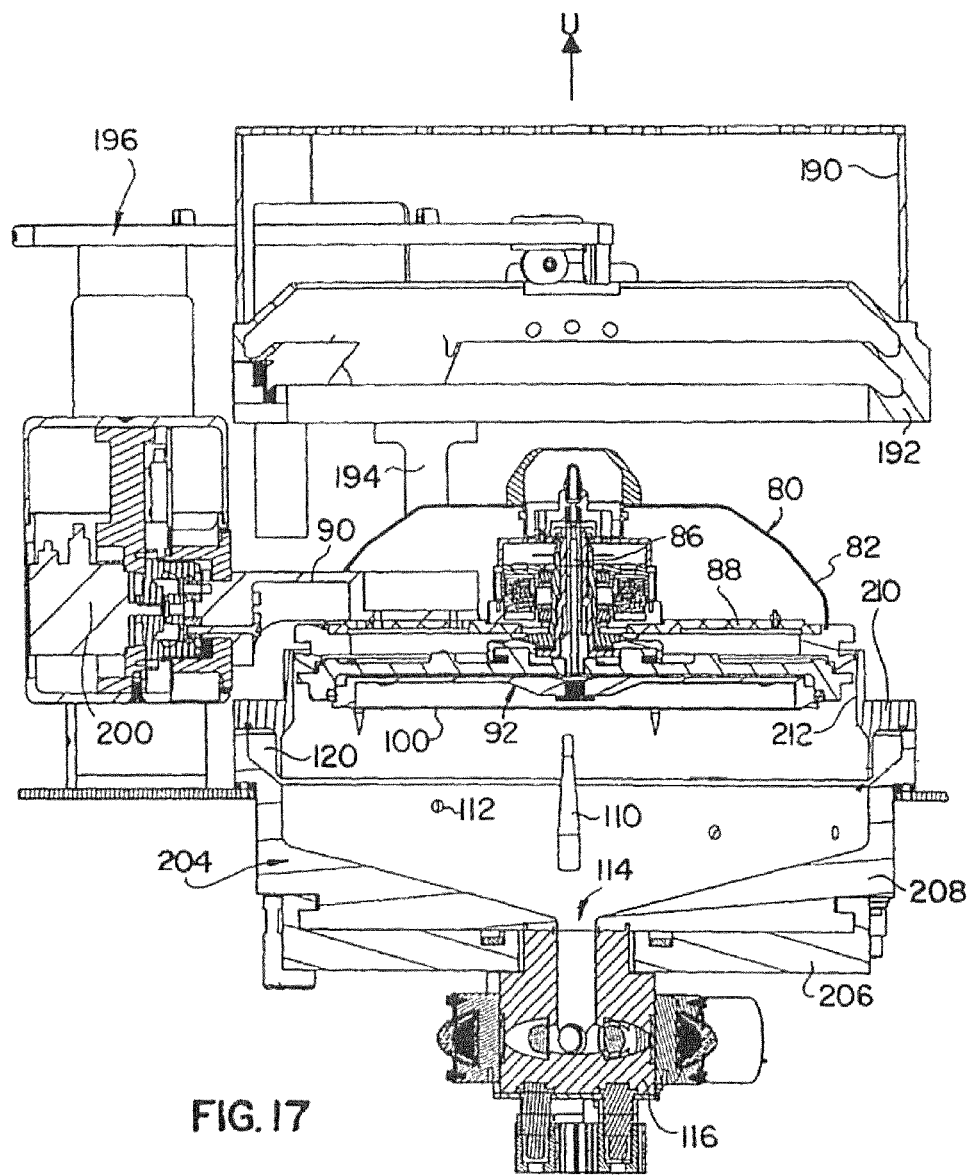
FIG. 17 is a section view taken along line 17-17 of FIG. 16.
Figure 18:
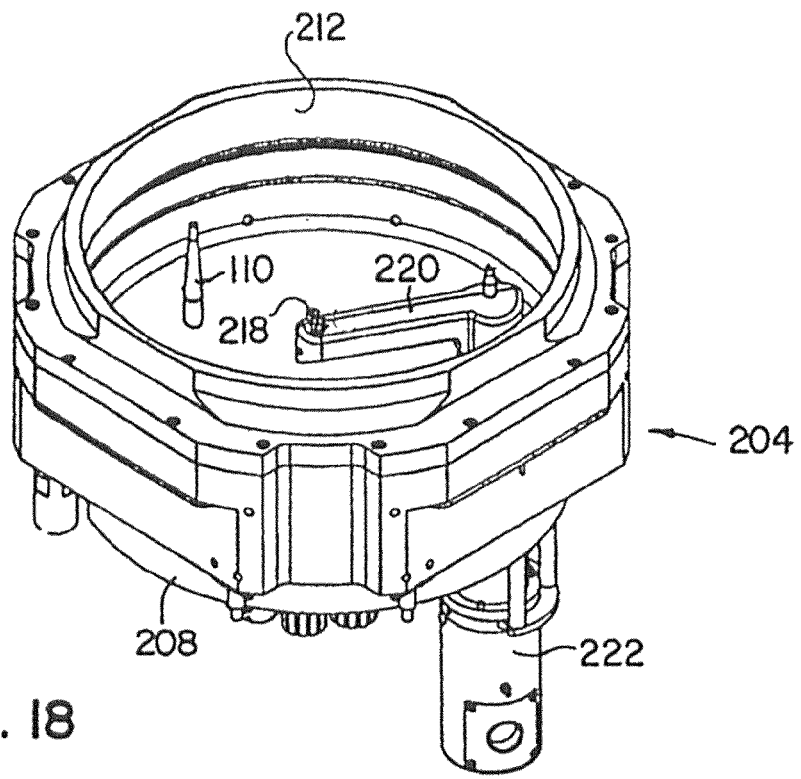
FIG. 18 is a perspective view of the bowl shown in FIGS. 16 and 17.

Referring momentarily to FIG. 5 flow sensors in the head 80 may be used to verify the flow of gas, indicating to the controller 34 that the robot 44 may be safely withdrawn. The robot 44 moves down and away from the rotor 92. Sensors on the robot 44 verify that the workpiece 100 is no longer on the robot 44. The robot then retracts away from the processor 50. The processor then operates as described above FIGS. 15-18 show an additional alternative system 180. The components and operation discussed above with reference to FIG. 12 apply as well to the system 180 shown in FIG. 15. The system 180 shown in FIG. 15 is similar to the system 30 shown in FIGS. 12-14. However, processor assemblies 182 are installed on the deck 52 within the enclosure 32, instead of the processors 50. As shown in FIGS. 16 and 17, one or more of the processor assemblies 182 includes a processor 184 which may be attached to a mounting plate 188, and a lift/rotate unit 186. The lift rotate unit 186 is attached to the head 80 through the head lifting arm 90, in place of the head lifter used in the system 30 shown in FIGS. 12-14. In addition to lifting the head 80 vertically up and away from the bowl 78, the lift/rotate unit 186 can also flip or rotate the head 80 into an upside down position.

As shown in FIG. 16, an air shield 190 is positioned on top of a rim 192 supported above the processor 184 on rim posts 194. Electrical wiring runs through cable guides 198 which generally extend from near the top of the enclosure 32 to the mounting plate 188. Referring to FIGS. 16 and 17, a drying process swing arm 196 is supported on and driven by a swing arm actuator 200 on the mounting plate 188, and to one side of the processor 184.

The head 80 shown in FIG. 17 is similar or the same as the head 80 shown in FIGS. 2-9 and described above. The head 80 shown in FIG. 17 is engageable with a bowl 204. The bowl 204 advantageously has a top section 210 having a cylindrical upper end 212, a center section 208, and a bottom plate 206. The bowl 204 also has a reciprocating spray swing arm 220 driven by an actuator 222. One or more spray or jet nozzles or inlets 218 are provided on the swing arm 220. The bowl 204 is otherwise similar to the bowl 78 described above. The process chemicals applied by the nozzles or inlets in the bowl 78 or 204 may be liquid acid solutions, such as HF, HCL, nitric acid, or sulphuric acid. Alternatively, the process chemicals may include liquid solvents.

The head 80 of the processor 184 operates in the same way as the head 80 described above relative to FIGS. 2-9. The nozzles or inlets 218 on the swing arm 220 apply process liquids onto the bottom surface of a workpiece 100. Fixed nozzles or inlets may also be used, with or without the swing arm nozzles. When this processing is complete, the lift/rotate unit 186 lifts the head 80 up and rotates the head into an upfacing position, i.e., the down facing surface of the wafer in the processing position shown in FIG. 17, is moved into an upfacing position. While the rotor 92 is rotating, the drying process swing arm 196 applies drying fluids onto the workpiece 100. The drying process swing arm 196 begins at or near the center of the workpiece and moves radially outwardly towards the edge of the workpiece, to dry the workpiece as described in U.S. patent application Ser. No. 11/075,099, incorporated herein by reference. The openings in the shield 190 help to diffuse and/or control downward air flow through the processor assembly 182.

The drying process swing arm 196 typically applies deionized water (DI) along with nitrogen and a solvent, such as isopropyl alcohol vapor, as the arm sweeps across the upfacing surface of the workpiece. A similar process could alternatively be performed by the swing arm 220 in the bowl 204. Other process liquids or gases including ozone gas, or ozone dissolved and/or entrained in a liquid, such as DI, may also be applied via fixed or moving nozzles or inlets in the bowl 78 or 204.

While the head is inverted or upfacing, gas flow through the rotor 92 continues, thereby holding the workpiece 100 against the contact pins 154. Similarly, the workpiece 100 is held onto the rotor 92 while the head 80 pivots from the downfacing position shown in FIG. 17 to the upfacing position by the normal force holding the workpiece against the contact pins 154.

Figure 19:
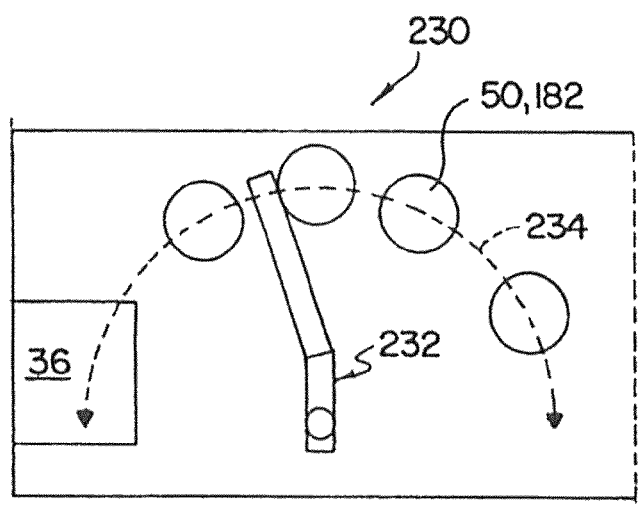
FIG. 19 is a schematic diagram of an alternative processing system.

FIG. 19 shows an alternative system design 230 having processors or processor assemblies 50 or 182 arranged in an arc 234, or other array or pattern, rather than the linear columns shown in FIGS. 12 and 15. Workpieces 100 may be moved into and out of the processors 50 or 182 by a single robot 232. While automated or robotic systems 30 and 180 have been shown and described, the head 80 and rotors 92 and 160 may be used in various other systems including manually operated and/or single processor machines.

The terms cylindrical, round, or circular also include multi-segmented shapes. The term engaged or engagement includes actual physical contact, as well as adjacent positioning allowing cooperation between the elements without physical contact between them. The term vortex or gas flow vortex means a flow of gas having a generally circular characteristic, and includes helical, spiral, and similar flows. The plural, as used here, includes the singular as well, and vice-versa. The terms attached to or supported on include both direct and indirect connections or interactions. Novel systems and methods have been shown and described. Various changes, substitutions and uses of equivalents may of course be made, without departing from the spirit and scope of the invention. The invention, therefore, should not be limited, except by the following claims and their equivalents.

The invention claimed is:
1. A workpiece processor, comprising:
   a bowl having one or more process fluid inlets;
   a head configured to engage with the bowl during workpiece processing;

a rotor configured to hold a workpiece and having an annular sidewall around a perimeter of the rotor, with the rotor supported on the head and rotatable relative to the head;

a pressurized gas inlet line on the rotor; and a plurality of gas inlets in the annular sidewall of the rotor, above the workpiece, with the inlets connected to the gas inlet line on the rotor and oriented to spray pressurized gas above an outer area of the workpiece in a direction at least partially tangent to the annular sidewall of the rotor, and with the spray of gas above the workpiece acting to hold the outer area of the workpiece onto the rotor.

2. The processor of claim 1 further comprising a plurality of gas nozzles in the annular sidewall oriented at least partially tangent to the annular sidewall.

3. The processor of claim 1 further comprising guide pins adjacent to a perimeter of the rotor.

4. The processor of claim 1 with the rotor including a drive plate and a chuck plate attached to the drive plate, and a gas flow path between the drive plate and the chuck plate.

5. The processor of claim 4 further comprising a seal between the drive plate and the chuck plate.

6. The processor of claim 4 further comprising a central opening in the chuck plate.

7. The processor of claim 1 further comprising process fluid inlets in the bowl positioned to spray a process liquid in a substantially straight line onto substantially all surfaces of a down facing side of a workpiece held in the rotor.

8. The processor of claim 1 further including guide pins on an outer perimeter of the rotor, with a workpiece holding position formed on the rotor inside of the guide pins, and with the guide pins extending from the rotor in a direction towards the bowl when the processor is in a processing position.

9. The processor of claim 1 with gas inlets oriented to spray pressurized gas in a direction within 30 degrees of a tangent of the sidewall of the rotor.

10. A centrifugal workpiece processor, comprising:
a base having one or more process liquid inlets;
a head movable onto the base;
a rotor on the head having a plate and side walls joined to the plate;
means for rotating the rotor;
partial vacuum creating means associated with the rotor for creating a partial vacuum adjacent to the sidewalls of the rotor, for holding an annular edge area of the workpiece into the rotor with no moving parts, via rotational gas flow.

11. The processor of claim 10 further comprising guide means associated with the rotor for maintaining a workpiece substantially aligned with the rotor.

12. The processor of claim 10 further comprising pins on a down-facing surface of the rotor, and with the holding means holding the workpiece into the rotor, and with the workpiece contacting only the pins and no other element of the rotor.

13. A workpiece processor, comprising:
a bowl having one or more process fluid inlets;
a head configured to engage with the bowl during workpiece processing;
a single rotor in the processor, with the rotor supported on the head and rotatable relative to the head;
a pressurized gas supply line in the rotor;
a plurality of gas inlets in the rotor at a perimeter of the rotor, with the inlets connected to the gas supply line and oriented to spray pressurized gas in a direction at least partially tangent to the sidewall of the rotor;
a plurality of circumferentially spaced apart pins adjacent to a perimeter of the lower surface of the rotor, and with the rotor configured to support a workpiece at a vertical position between the gas outlets and the bowl during processing with only the pins of the rotor contacting the back side of the workpiece when the workpiece is in a processing position in the rotor;
and with the rotor configured to hold the workpiece regardless of the orientation of the rotor relative to gravity, by providing reduced gas pressure above the workpiece.

14. The processor of claim 13 with gas inlets oriented to spray pressurized gas in a direction within 30 degrees of a tangent of the sidewall of the rotor.

15. A workpiece processor, comprising:
a bowl having one or more process fluid inlets;
a head;
a head lifter attached to the head;
a rotor in the head having an outer perimeter and an annular outer sidewall around the outer perimeter;
a plurality of gas inlet nozzles in the annular sidewall of the rotor with the nozzles oriented to spray pressurized gas in a direction at least partially tangent to the annular sidewall of the rotor, and with the spray of gas having a higher velocity and lower pressure adjacent to the annular sidewall of the rotor and a lower velocity and a higher pressure adjacent to the center of the rotor, to hold the outer area of the workpiece onto the rotor.

* * * * *